(12) United States Patent
Rizzolo et al.

(10) Patent No.: US 11,018,090 B2
(45) Date of Patent: May 25, 2021

(54) SELECTIVE CVD ALIGNMENT-MARK TOPOGRAPHY ASSIST FOR NON-VOLATILE MEMORY

(71) Applicant: INTERNATIONAL BUSINESS MACHINES CORPORATION, Armonk, NY (US)

(72) Inventors: Michael Rizzolo, Albany, NY (US); Chih-Chao Yang, Glenmont, NY (US); Lawrence A. Clevenger, Saratoga Springs, NY (US); Benjamin D. Briggs, Waterford, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/659,995

(22) Filed: Oct. 22, 2019

(65) Prior Publication Data

US 2020/0051924 A1    Feb. 13, 2020

Related U.S. Application Data

(62) Division of application No. 15/983,689, filed on May 18, 2018, now Pat. No. 10,515,903.

(51) Int. Cl.
*H01L 23/544* (2006.01)
*H01L 27/22* (2006.01)

(52) U.S. Cl.
CPC .......... *H01L 23/544* (2013.01); *H01L 27/222* (2013.01); *H01L 2223/544* (2013.01)

(58) Field of Classification Search
None
See application file for complete search history.

(56) References Cited

U.S. PATENT DOCUMENTS 5,401,691 A * 3/1995 Caldwell ............... H01L 23/544
257/E23.179
5,935,764 A * 8/1999 Kakehashi .......... G03F 7/70633
430/314

(Continued)

OTHER PUBLICATIONS

US Office Action issued in U.S. Appl. No. 16/661,383 dated Oct. 14, 2020, pp. 1-45.

(Continued)

*Primary Examiner* — Nishath Yasmeen
(74) *Attorney, Agent, or Firm* — Tutunjian & Bitetto, P.C.; James Nock

(57) ABSTRACT

A semiconductor device and method for forming the semiconductor device are described. The method includes recessing a device pad to below a top surface of an interconnect layer and depositing a cap in the recess over the device pad. A topography assist layer is formed over each of at least one alignment mark using a selective deposition process that deposits material on conductive material of the at least one alignment mark selective to the metal nitride of the device pad such that a top surface of the topography assist feature is higher than a top surface of the cap. Device layers are deposited conformally over the interconnect layer such that the topography assist layer causes a topographical feature in a top surface of the deposited device layers, the topographical feature being vertically aligned with the topography assist layer. The device pad is aligned according to the topographical feature.

20 Claims, 10 Drawing Sheets

(56) References Cited

U.S. PATENT DOCUMENTS

| | | | |
|---|---|---|---|
| 6,858,441 B2 | 2/2005 | Nuetzel et al. | |
| 6,933,204 B2 | 8/2005 | Sarma et al. | |
| 6,979,526 B2 | 12/2005 | Ning | |
| 7,223,612 B2 | 5/2007 | Sarma | |
| 7,507,633 B2 | 3/2009 | Kanakasabapathy et al. | |
| 7,795,105 B2 * | 9/2010 | Goller | G03F 9/7084 438/401 |
| 7,825,000 B2 | 11/2010 | Kanakasabapathy et al. | |
| 8,542,526 B2 * | 9/2013 | Keshtbod | B82Y 10/00 365/158 |
| 8,754,421 B2 | 6/2014 | Duval et al. | |
| 9,536,744 B1 | 1/2017 | Cheng et al. | |
| 9,865,798 B2 | 1/2018 | Lu et al. | |
| 2001/0001735 A1 * | 5/2001 | Chu | H01L 23/544 438/690 |
| 2004/0043579 A1 * | 3/2004 | Nuetzel | H01L 23/544 438/401 |
| 2005/0242382 A1 * | 11/2005 | Daughton | B82Y 10/00 257/295 |
| 2006/0002184 A1 * | 1/2006 | Hong | G11B 5/3906 365/171 |
| 2006/0276034 A1 * | 12/2006 | Blanchard | H01L 21/76832 438/672 |
| 2008/0036485 A1 * | 2/2008 | Nagai | H01L 22/20 324/750.18 |
| 2009/0289368 A1 * | 11/2009 | Yang | H01L 23/53223 257/751 |
| 2015/0228572 A1 * | 8/2015 | Yang | H01L 21/7682 257/751 |
| 2016/0093668 A1 * | 3/2016 | Lu | H01L 21/76802 257/421 |
| 2016/0093670 A1 | 3/2016 | Jiang et al. | |
| 2016/0268336 A1 * | 9/2016 | Shum | H01L 43/12 |
| 2016/0365505 A1 * | 12/2016 | Lu | H01L 43/08 |
| 2017/0084819 A1 * | 3/2017 | Lu | H01L 43/12 |

OTHER PUBLICATIONS

List of IBM Patents or Patent Applications Treated as Related dated Oct. 22, 2019, 2 pages.

\* cited by examiner

Pattern a block mask to cover landing pads of an alignment and logic region of a semiconductor device and expose a landing pad of a device region, the landing pads being formed in an interconnect layer of the semiconductor device
1001

Recess the landing pad in the device region of the semiconductor device
1002

Form a cap in the recess of the landing pad in the device region
1003

Remove the block mask and selectively deposit topographical assist features over the landing pads of the alignment and logic region of the semiconductor device using a selective metal
1004

Deposit a device multilayer over the interconnect layer, including the landing pads, cap and topographical assist features, the device multilayer having a constant thickness across the semiconductor device to form bump in a top surface thereof over the topographical assist features
1005

Align the semiconductor device according to the bumps in the device multilayer
1006

Selectively etch the device multilayer to form a memory device stack aligned with the landing pad in the device region
1007

Bury the memory device stack in a dielectric fill and form contacts on both sides of the landing pad of the device region and at least one landing pad of the logic region
1008

FIG. 10

SELECTIVE CVD ALIGNMENT-MARK TOPOGRAPHY ASSIST FOR NON-VOLATILE MEMORY

BACKGROUND

Technical Field

The present invention generally relates to semiconductor device alignment, and more particularly to selective chemical vapor deposition (CVD) alignment-mark topography assist for non-volatile memory.

Description of the Related Art

Embedded memory devices are an increasingly popular form of memory device. Such embedded devices can include non-volatile memory devices such as, e.g., magnetic tunnel junctions (MTJ) and other magnetoresistive random access memory (MRAM) or resistive random access memory (RRAM) devices. However, techniques for embedding such memory devices can often be wasteful, inefficient and inaccurate. Due to the scale of these devices, relatively small inaccuracies in aligning the memory device with metallization structures, such as contact pads and wiring, can result in non-functional devices. But improving alignment by removing material to view markings and structures may have chemical incompatibility issues depending on the etch chemistries and adds complications to device formation, thus driving up costs.

SUMMARY

In accordance with an embodiment of the present invention, a method for forming a semiconductor device is described. The method includes recessing a device pad to below a top surface of an interconnect layer and depositing a cap in the recess over the device pad. A topography assist layer is formed over each of at least one alignment mark using a selective deposition process that deposits material on metal of the at least one alignment mark selective to the cap of the device pad such that a top surface of the topography assist feature is higher than a top surface of the cap. Device layers are deposited conformally over the interconnect layer such that the topography assist layer causes a topographical feature in a top surface of the deposited device layers, the topographical feature being vertically aligned with the topography assist layer. The device pad is aligned according to the topographical feature.

In accordance with an embodiment of the present invention, a method for forming a semiconductor device is described. The method includes forming pads in a dielectric layer on a substrate to form an interconnect layer with at least an alignment region and a device region. A block mask is patterned over the alignment region. A pad is recessed in the device region to below a top surface of an interconnect layer. A metal nitride is deposited in the recess over the device pad. A topography assist layer is formed over each of at least one alignment mark using a selective deposition process that deposits material on conductive material of the at least one alignment mark selective to the metal nitride of the device pad. Device layers are deposited conformally over the interconnect layer such that the topography assist layer causes a topographical feature in a top surface of the deposited device layers, the topographical feature being vertically aligned with the topography assist layer. The device region is aligned according to the topographical feature.

In accordance with an embodiment of the present invention, a semiconductor device is described. The device includes a dielectric material formed on a substrate having a landing pad in a device region and a landing pad in an alignment region formed within the dielectric material. A cap is formed in an upper portion of the landing pad in the device region. A topography assist layer is formed on the landing pad in the alignment region, the topography assist layer having an upper surface that is at a different level than an upper surface of the cap relative to the substrate. A memory device is embedded in the dielectric material and aligned over the cap.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein:

FIG. 10 is a block/flow diagram showing a system/method for making a semiconductor device having contacts aligned with pads through device layers, in accordance with an embodiment of the present invention.

DETAILED DESCRIPTION

Figure 1:
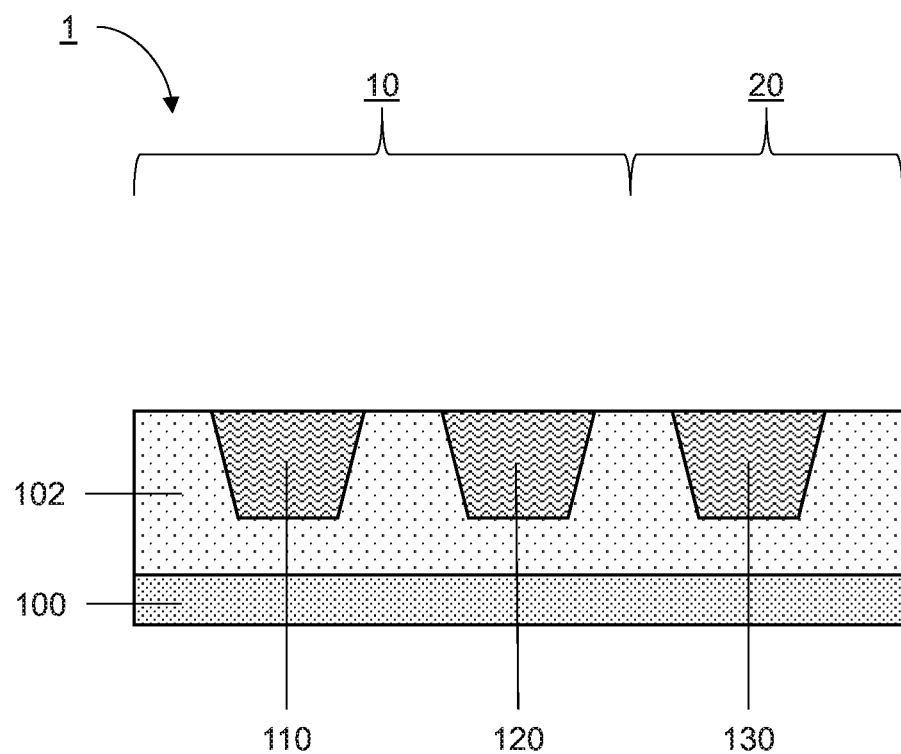
FIG. 1 is a cross-sectional view showing a semiconductor device having a device region and a logic and alignment mark region, in accordance with an embodiment of the present invention.

Aspects of the present invention assists alignment of embedded devices with underlying metallization structures. A semiconductor device is constructed with a substrate and a dielectric layer on the substrate. Within the dielectric layer are metallization structures, including landing pads for devices. A dielectric cap is formed over the landing pads of a device region of the semiconductor device. A selective metal can then be deposited over the remaining landing pads. As a result, the selective metal forms topological features over the semiconductor device in the areas of the landing pads that are not part of the device region.

Upon forming layers for memory elements over the dielectric layer, the topological features will be translated through the layers. This results in physical bumps formed on a top surface of the memory element layers directly over the positions of the landing pads that are not in the device region. Thus, easy alignment can be performed with the bumps as a reference.

Vias can be formed down to selected landing pads based on the alignment of the bumps. The vias can then be filled with conductive material to form contacts, while memory devices can be embedded beneath the conductive material over landing pads in the device region. Accordingly, the memory devices can be properly and accurately aligned with memory device landing pads within the semiconductor device without the need for complicated and wasteful material deposition and removal techniques.

Exemplary applications/uses to which the present invention can be applied include, but are not limited to: embedding non-volatile devices within a semiconductor device, such as, e.g., embedding magnetoresistive random access memory (MRAM) or resistive random access memory (RRAM) devices within the semiconductor device.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Referring now to the drawings in which like numerals represent the same or similar elements and initially to FIG. 1, depicting a cross-sectional view of a semiconductor device having a device region and a logic and alignment mark region in accordance with an embodiment of the present invention.

A semiconductor device 1 is shown in accordance with one embodiment. The device 1 includes a substrate 100 having multiple layers formed thereon. The substrate 100 can include any suitable substrate structure, e.g., a bulk semiconductor, a semiconductor-on-insulator (SOI) substrate, etc. In one example, the substrate 100 can include a silicon-containing material. Illustrative examples of Si-containing materials suitable for the substrate 100 can include, but are not limited to, Si, SiGe, SiGeC, SiC and multi-layers thereof. Although silicon is the predominantly used semiconductor material in wafer fabrication, alternative semiconductor materials can be employed as additional layers, such as, but not limited to, germanium, gallium arsenide, gallium nitride, silicon germanium, cadmium telluride, zinc selenide, etc.

The semiconductor device 1 further includes an interconnect layer 102. The interconnect layer 102 can be formed of a suitable insulator or dielectric. As used herein, the terms "insulating" and "dielectric" denote a material having a room temperature conductivity of less than about $1\times10^{-10}$ $(\Omega\text{-m})^{-1}$. For example, the interconnect layer 102 can be formed of, e.g., silicon dioxide ($SiO_2$).

Within the material of the interconnect layer 102 are conductive structures, such as, e.g., landing pads 110, 120 and 130. The landing pads 110, 120 and 130 can include any suitable conductive material, such as polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tungsten silicide, tungsten nitride, ruthenium oxide, cobalt silicide, nickel silicide), carbon nanotube, conductive carbon, graphene, or any suitable combination of these materials. The conductive material can further comprise dopants that are incorporated during or after deposition. According to aspects of an embodiment of the present invention, the landing pads 110, 120 and 130 are formed of copper (Cu).

The interconnect layer 102, according to aspects of the present invention, can include at least two regions, including a second region 10 and a device region 20. Landing pads 110 and 120 are in the second region 10 while landing pad 130 is in the device region 20. As used herein, the term "memory device" means a structure in which the state characteristics can be altered and then retained in the altered state to store a bit of information. Possible state characteristics can include, e.g., electrical, magnetic, resistive, phase, or material states, among others.

Figure 2:
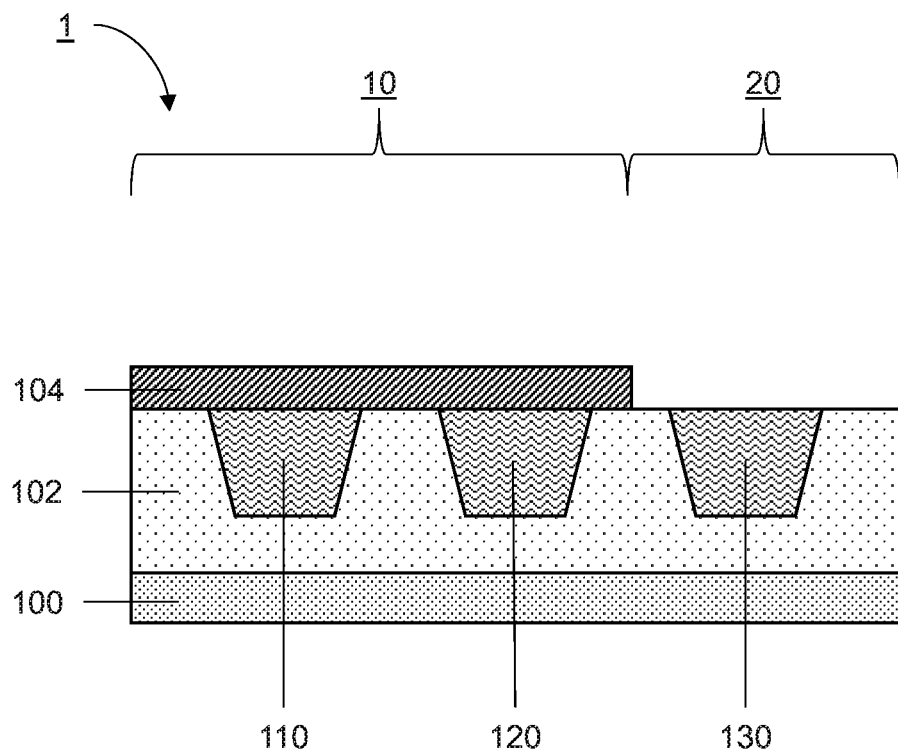
FIG. 2 is a cross-sectional view a semiconductor device having a block mask over a logic and alignment mark region and an exposed device region, in accordance with an embodiment of the present invention.

Referring now to FIG. 2, depicting a cross-sectional view of a semiconductor device having a block mask over a logic and alignment mark region and an exposed device region in accordance with an embodiment of the present invention.

According to aspects of the present invention, a block mask 104 can be formed over the device 1. The block mask 104 can comprise soft and/or hardmask materials and can be formed using deposition, photolithography and etching. In one embodiment, the block mask 104 is a hardmask composed of a nitride-containing material, such as silicon nitride. It is noted that it is not intended that the block mask 104 be limited to only silicon nitride, as the composition of the hardmask can include any dielectric material that can be deposited by chemical vapor deposition (CVD) and related methods. Other hardmask compositions for the block mask 104 can include silicon oxides, silicon oxynitrides, silicon carbides, silicon carbonitrides, etc. Spin-on dielectrics can also be utilized as a hardmask material including, but not limited to: silsequioxanes, siloxanes, and boron phosphate silicate glass (BPSG).

In one embodiment, a block mask 104 can include a hardmask material, which can be formed by blanket depositing a layer of hardmask material, providing a patterned photoresist atop the layer of hardmask material, and then etching the layer of hardmask material to provide a block mask 104 protecting at least one portion of the interconnect layer 102, e.g., the second region 10 of the device 1.

A patterned photoresist can be produced by applying a blanket photoresist layer to the surface of the interconnect layer 102, exposing the photoresist layer to a pattern of radiation, and then developing the pattern into the photoresist layer utilizing resist developer. Etching of the exposed portion of the block mask 104 that is overlying the device region 20 can include an etch chemistry for removing the exposed portion of the hardmask material and having a high selectivity to at least the block mask 104 and the dielectric material of the interconnect layer 102 that is present in the device region 20. In one embodiment, the etch process can be an anisotropic etch process, such as reactive ion etch (RIE).

In some embodiments, following the formation of the block mask 104, the exposed surface of the interconnect layer 102 is cleaned to remove any residual layers, foreign particles, and any residual metallic surface contamination. In one embodiment, the chemical cleaning process includes a first step of treating the exposed portion of the interconnect layer 102 with hydrofluoric acid (HF), a second step of treating the surface of the exposed portion of the first semiconductor layer 20a with a solution of ammonium hydroxide ($NH_4OH$) and hydrogen peroxide ($H_2O_2$), and a third step of treating the surface with an aqueous mixture of hydrochloric acid (HCl) and an oxidizing agent selected from the group consisting of hydrogen peroxide, ozone ($O_3$) and combinations thereof. The cleaning steps that include the application of the solution of ammonium hydroxide and hydrogen peroxide and the aqueous mixture of hydrochloric acid and the oxidizing agent can be provided by an RCA clean sequence.

Figure 3:
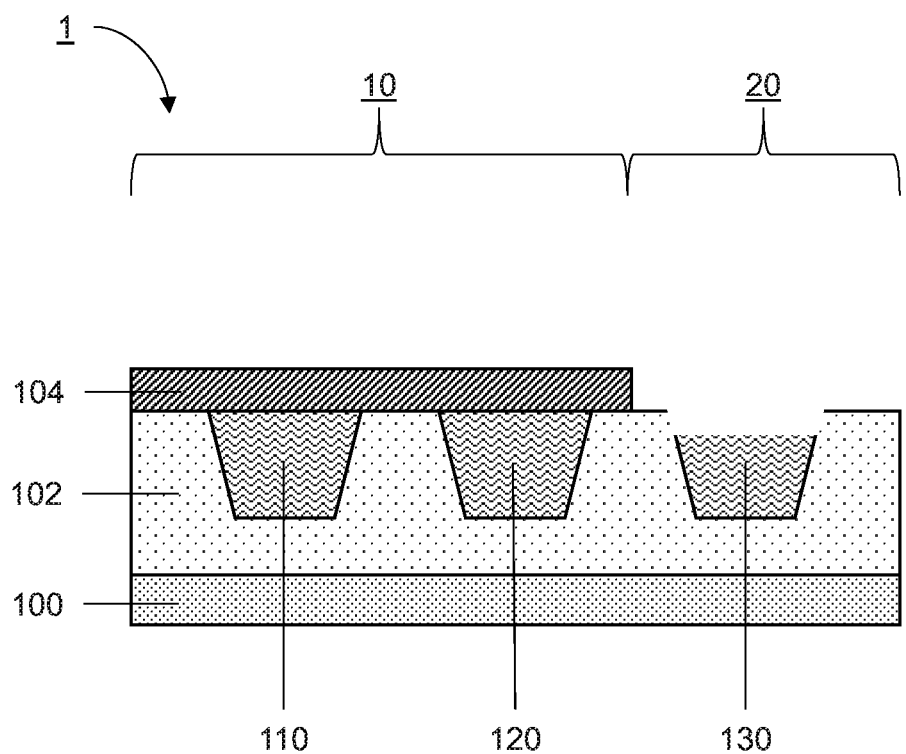
FIG. 3 is a cross-sectional view showing a semiconductor device have a recessed pad in a device region, in accordance with an embodiment of the present invention.

Referring now to FIG. 3, depicting a cross-sectional view of a semiconductor device have a recessed pad in a device region in accordance with an embodiment of the present invention.

With the device region 20 exposed and the second region 10 protected by the block mask 104, landing pad 130 can be recessed. An etching process can remove the unprotected portions of the landing pad 130 selective to the surrounding dielectric material of the interconnect layer 102. As used herein, the term "selective" in reference to a material removal process denotes that the rate of material removal for a first material is greater than the rate of removal for at least another material of the structure to which the material removal process is being applied.

For example, the transferring of the pattern provided by the photoresist into the underlying structures can include an anisotropic etch. As used herein, an "anisotropic etch process" denotes a material removal process in which the etch rate in the direction normal to the surface to be etched is greater than in the direction parallel to the surface to be etched. The anisotropic etch can include reactive-ion etching (RIE). Other examples of anisotropic etching that can be used at this point of the present invention include ion beam etching, plasma etching or laser ablation.

The etch process can remove a particular portion of the landing pad 130. In some embodiments, the etch process can recess the landing pad 130 by a depth in the range of between about 10 nanometers and about 50 nanometers below a top surface of the interconnect layer 102.

Figure 4:
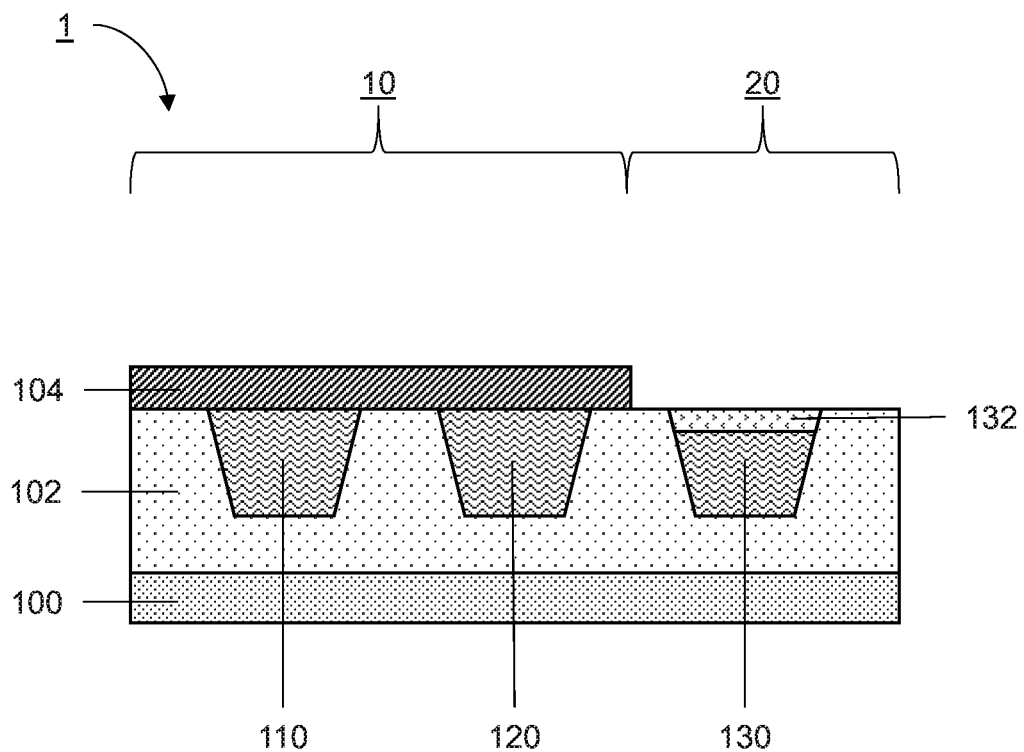
FIG. 4 is a cross-sectional view showing a pad of a device region on a semiconductor device having a dielectric cap filling a recessed portion of the pad, in accordance with an embodiment of the present invention.

Referring now to FIG. 4, depicting a cross-sectional view of a pad of a device region on a semiconductor device having a dielectric cap filling a recessed portion of the pad in accordance with an embodiment of the present invention.

A cap 132 can be formed in a recessed portion of the landing pad 130. The cap 132 forms a conductive buffer or adhesion layer between the conductive material of the landing pad 130 and layers of a memory device to be formed thereon. In the case that the landing pad 130 is formed of copper, the cap 132 can include, e.g., a metal nitride (for example, tantalum nitride (TaN) or cobalt nitride (CoN) among others). In one embodiment, the deposition process for forming the cap 132 comprises CVD, PECVD, PVD, high-density plasma CVD, IPVD, or spin-on glass process.

Chemical vapor deposition (CVD) is a deposition process in which a deposited species is formed as a result of chemical reaction between gaseous reactants at greater than room temperature (25.degree. C. to 900.degree. C.); wherein solid product of the reaction is deposited on the surface on which a film, coating, or layer of the solid product is to be formed. Variations of CVD processes include, but not limited to, Atmospheric Pressure CVD (APCVD), Low Pressure CVD (LPCVD) and Plasma Enhanced CVD (EPCVD), Metal-Organic CVD (MOCVD) and combinations thereof can also be employed.

The cap 132 can be formed such that it has a top surface that is coplanar with the top surface of the interconnect layer 102. Thus, a single flat surface is formed by the interconnect layer 102 and the cap 132. The top surface of the cap 132 can be made coplanar with the top surface of the interconnect layer 102 by, e.g., chemical mechanical planarization (CMP), or a suitable deposition and/or planarization process.

Figure 5:
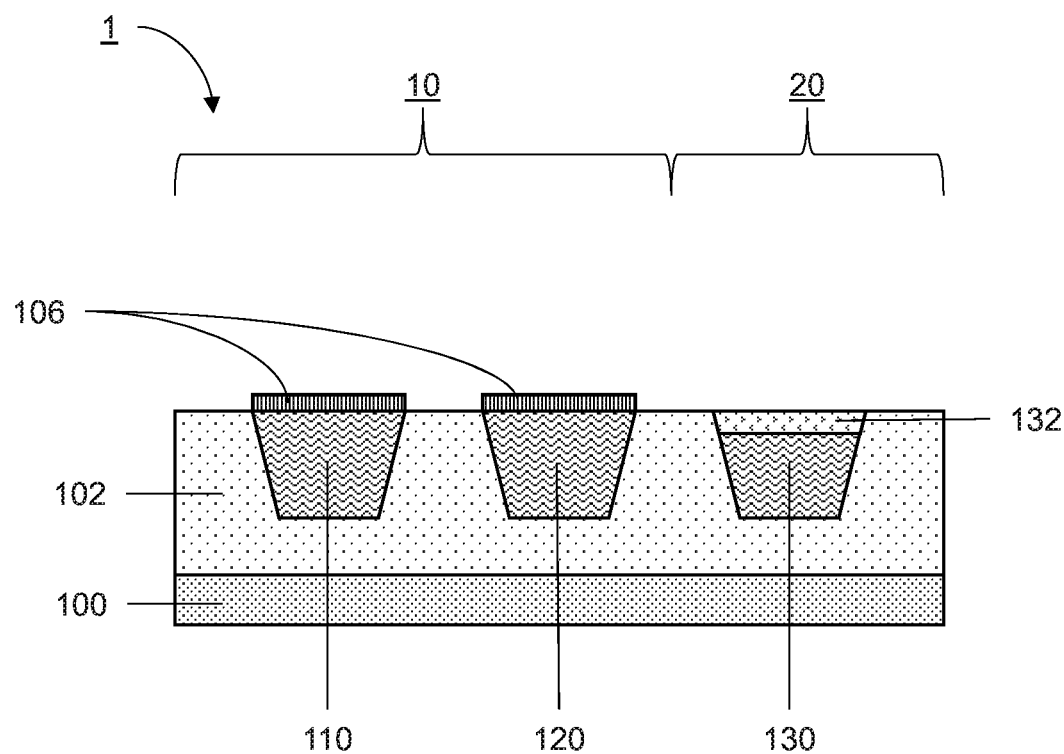
FIG. 5 a cross-sectional view showing a semiconductor device having selective metal caps formed over pads in a logic and alignment mark region, in accordance with an embodiment of the present invention.

Referring now to FIG. 5, depicting a cross-sectional view of a semiconductor device having selective metal caps formed over pads in a logic and alignment mark region in accordance with an embodiment of the present invention.

According to aspects of the present invention, the block mask 104 can be removed from the surface of the interconnect layer 102. The block mask 104 can be removed by an etch process, including anisotropic etching with processes including, e.g., RIE. Accordingly, the etching process can remove the block mask 104 selective to the dielectric material of the interconnect layer 102 as well as the cap 132 of in the device region 20. Thus, the second region 10 is exposed from beneath the block mask 104, including the landing pads 110 and 120.

Once exposed, a topographic assist feature 106 can be formed over each of landing pads 110 and 120 in the second region 10. The topographic assist features 106 can be formed through a selective deposition process, including, e.g., CVD or electroless plating. The deposition process can, therefore, layers of material over landing pads 110 and 120 selective to the exposed dielectric material of the interconnect layer 102 as well as the cap 132 over landing pad 130. Thus, topographic assist features 106 have a top surface extending beyond a top surface of the interconnect layer 102 corresponding to a thickness of the topographic assist features 106. The thickness can be in a suitable range. For example, the topographic assist features 106 can have a thickness in the range of between about 10 nanometers and about 50 nanometers. Accordingly, the topographic assist features 106 have a top surface that is between about 10 nanometers and about 50 nanometer further from an interface between the interconnect layer 102 and the substrate 100 than a top surface of the interconnect layer 102. However, other suitable ranges for producing topological features on the interconnect layer 102 are contemplated.

Figure 6:
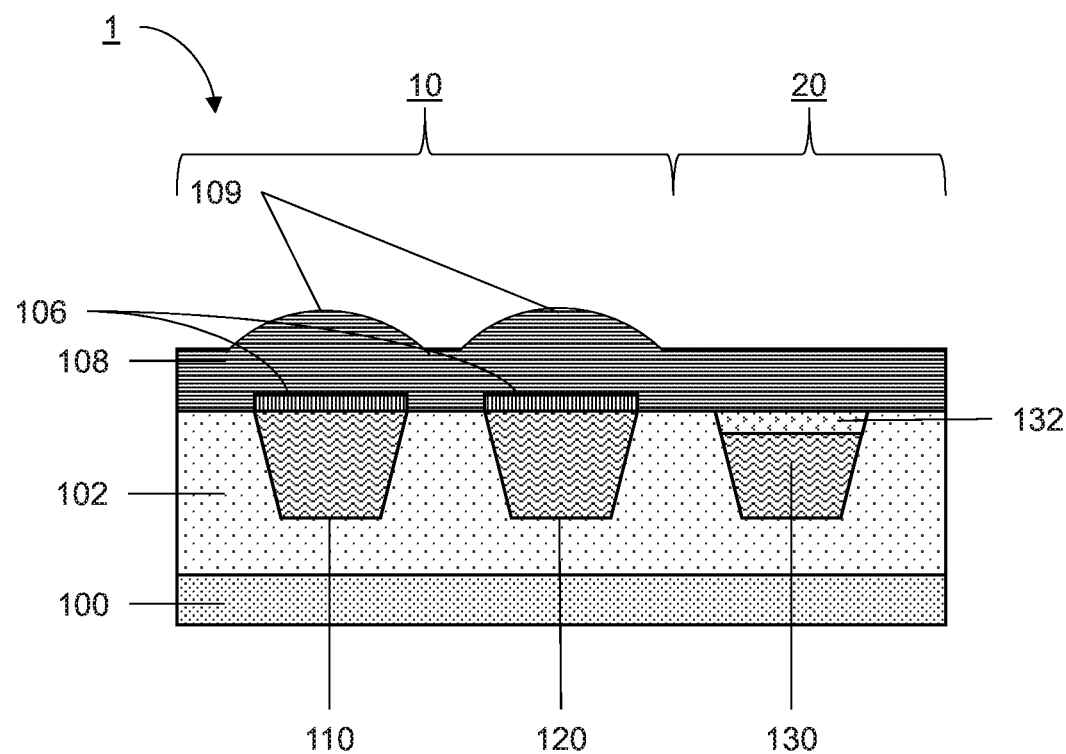
FIG. 6 is cross-sectional view showing a semiconductor device having a device layers formed over each region of the semiconductor device with topographic features over pads in a logic and alignment mark region, in accordance with an embodiment of the present invention.

Referring now to FIG. 6, depicting a cross-sectional view of a semiconductor device having a device layers formed over each region of the semiconductor device with topographic features over pads in a logic and alignment mark region in accordance with an embodiment of the present invention.

According to aspects of the present invention, a device multilayer 108 can be formed over the interconnect layer 102. The device multilayer 108 can include multiple layers, including metals and dielectrics used for memory elements. Depending on the type of memory element used, different combinations of layers can be used to form the device multilayer 108. For example, for a magnetoresistive random access memory (MRAM) device, the layers can include alternating layers of ferromagnets and insulators. However, other layer combinations are contemplates, such as those corresponding to resistive random access memory (RRAM), phase-change random access memory (PCRAM), and ferroelectric random access memory (FeRAM) devices.

Each of the layers in the device multilayer 108 can be formed through deposition processes, such as, e.g., CVD. Each layer is deposited conformally over the surface of the preceding layers. As a result, the device multilayer 108 conforms to the surface topography of the interconnect layer 102, including the raised portions of the topography assist features 106. Thus, as a result of the deposition of multiple layers to form the device multilayer 108, topographical features are formed on the surface of the device multilayer 108. These topographic features can take the form of bumps 109 formed over the topography assist features 106. Thus, the bumps 109 accurately and reliably mark positions on the top surface of the device multilayer that are vertically aligned with landing pads 110 and 120. The bumps 109 can therefore be used for feature alignment for subsequent processing to, e.g., embed memory devices, transistors, or other devices.

Figure 7:
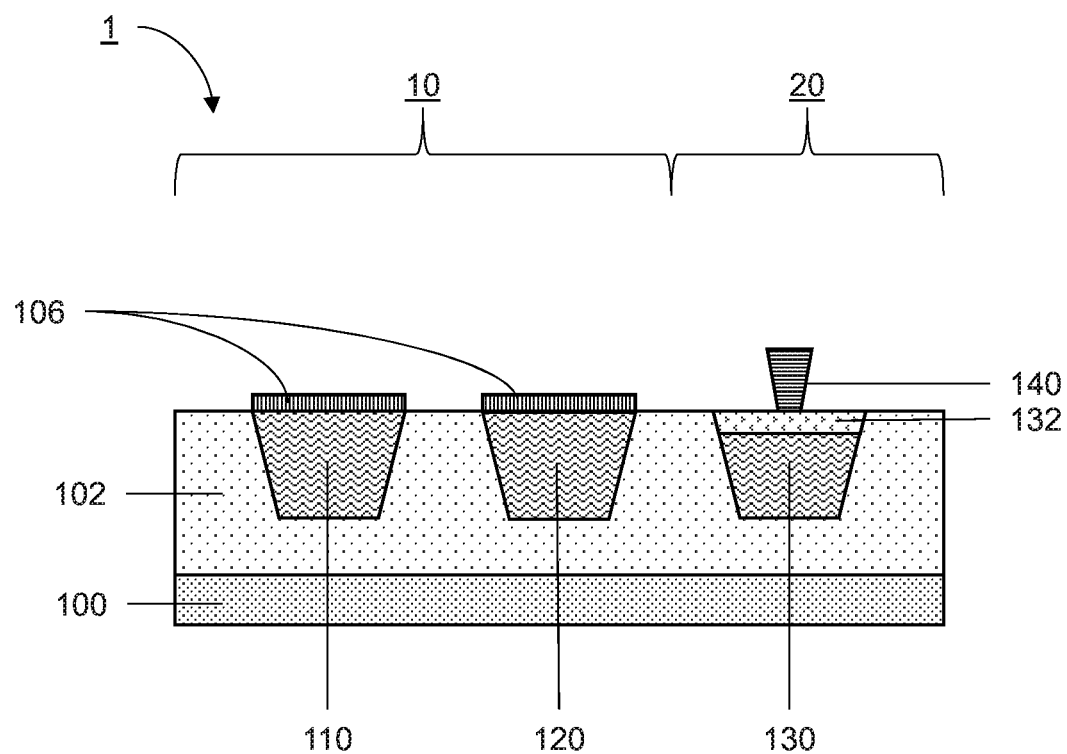
FIG. 7 is a cross-sectional view showing a semiconductor device having a memory device aligned with a pad in the device region, in accordance with an embodiment of the present invention.

Referring now to FIG. 7, depicting a cross-sectional view of a semiconductor device having a memory device aligned with a pad in the device region in accordance with an embodiment of the present invention.

According to aspects of the present invention, an embedded memory device 140 can be formed from the device multilayer 108. By aligning the device 1 using the bumps 109, a position of the landing pad 130 can be accurately determined. Thus, an optical alignment system configured to identify the bumps 109 can accurately position the device 1 for proper alignment. The alignment is performed for a masking process, including, e.g., depositing a mask over the device multilayer 108 and performing lithographic patterning. The patterning can be, e.g., a positive tone process to cure the mask in the position on the device multilayer 108 aligned over the landing pad 130 according to the alignment based on the bumps 109. The remainder of mask is removed, leaving behind an aligned block mask aligned with the landing pad 130.

Selective etching can then be performed by an etch process, such as, e.g., an anisotropic etch process including RIE. The etch process can etch the device multilayer 108 selective to the aligned block mask. As a result, the device multilayer 108 is removed, with a column of the multilayer materials, forming a memory device 140, remaining in a position over the landing pad 130. Because the bumps 109 of the device multilayer 108 were accurately and precisely positioned over the landing pads 110 and 120, the aligned block mask was also aligned precisely over the landing pad 130, to permit the alignment of the memory device 140 in the center of the landing pad 130. Thus, the memory device 140 is formed on the cap 132 of the landing pad 130 in the device region 20.

Figure 8:
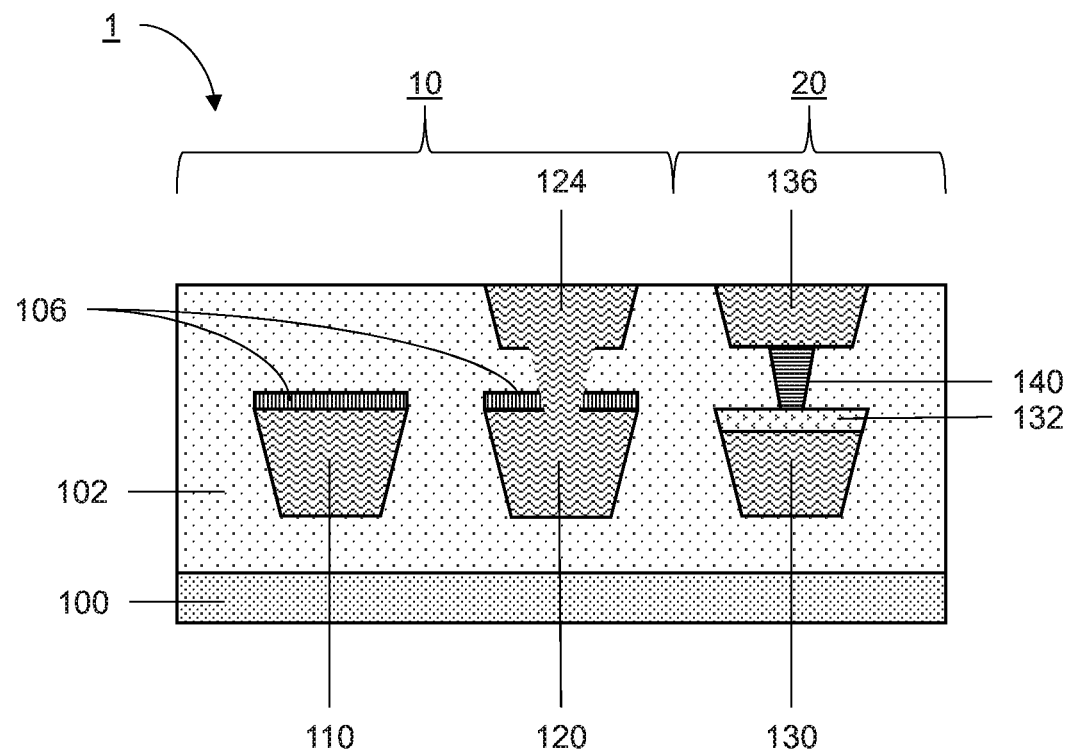
FIG. 8 is cross-sectional view showing a semiconductor device having vias in an additional dielectric layer filled with a conductive fill, with a memory device between the conductive fill and the pad of the device region, in accordance with an embodiment of the present invention.

Referring now to FIG. 8, depicting a cross-sectional view of a semiconductor device having vias in an additional dielectric layer filled with a conductive fill, with a memory device between the conductive fill and the pad of the device region in accordance with an embodiment of the present invention.

According to aspects of the present invention, the memory device 140 can be embedded within the semiconductor device 1. Embedding the memory device 104 can be performed by depositing additional dielectric material over the interconnect layer 102 and around the memory device 140 to extend the dielectric material of the interconnect layer 102 above the memory device 140. Thus, the memory device 140 is buried in the dielectric fill of the interconnect layer 102.

The extended interconnect layer 102 is then patterned and etched to form via holes over landing pads 120 and 130. According to some embodiments, no via is formed over landing pad 110, however, other via arrangements are contemplated. The patterning is aligned with landing pads 120 and 130 using bumps resulting from the deposition of the dielectric fill over the topographic assist features. Alternatively, the alignment is based on the previous alignment established by bumps 109. The via corresponding to landing pad 124 is etched down through the dielectric fill and the topographic assist feature 106 down to the landing pad 120. Accordingly, a top surface of the landing pad 120 is exposed by etching the via. The via corresponding to landing pad 130, on the other hand, only extends through the dielectric fill down to the memory device 140. Accordingly, a top surface of the memory device 140 is exposed by etched the via.

Following via formation, contacts 124 and 136 are formed by depositing a conductive metal into the via holes using deposition methods, such as CVD, sputtering or plating. The conductive metal can include, but is not limited to: tungsten, copper, aluminum, silver, gold and alloys thereof. The conductive material extends down to the memory device 140 in the device region 20, and down the landing pad 120 in the second region 10. Accordingly, contacts 124 and 136 are formed through the interconnect layer 102 for a short in the second region 10, and for the memory device 140, respectively.

Figure 9:
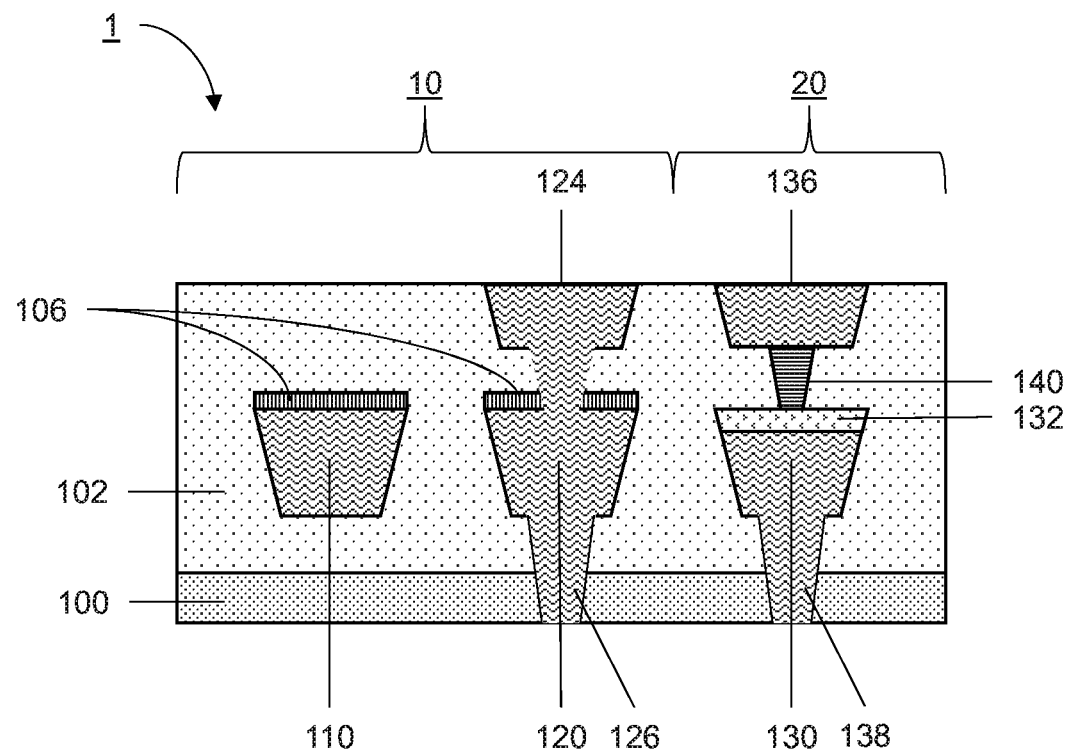
FIG. 9 is cross-sectional view showing a semiconductor device having middle of line contacts formed through a dielectric layer in contact with pads in a device region and a logic region, in accordance with an embodiment of the present invention.

Referring now to FIG. 9, depicting a cross-sectional view of a semiconductor device having middle of line contacts formed through a substrate and dielectric layer in contact with pads in a device region and a logic and alignment mark region in accordance with an embodiment of the present invention.

Middle of line contacts 126 and 138 are formed on a side of the landing pads 120 and 130, respectively, opposite to the contacts 124 and 136. The middle of line contacts 126 and 138 can be formed by patterning and etching the substrate 100 and interconnect layer 102 to form via holes under landing pads 120 and 130. According to some embodiments, no via is formed under landing pad 110, however, other via arrangements are contemplated. The patterning is aligned with landing pads 120 and 130 according to the previous alignment established by bumps 109. Accordingly, bottom surfaces of the landing pads 120 and 130 are exposed by etching the vias.

Following via formation, middle of line contacts 126 and 138 are formed by depositing a conductive metal into the via holes using deposition methods, such as CVD, sputtering or plating. The conductive metal can include, but is not limited to: tungsten, copper, aluminum, silver, gold and alloys thereof. Accordingly, middle of line contacts 126 and 138 are formed through the interconnect layer 102 and substrate 100 for a short in the second region 10, and for the memory device 140, respectively.

Referring now to FIG. 10, depicting a block/flow diagram of a system/method for making a semiconductor device having contacts aligned with pads through device layers in accordance with an embodiment of the present invention.

At block 1001, pattern a block mask to cover landing pads of an alignment and logic region of a semiconductor device and expose a landing pad of a device region, the landing pads being formed in an interconnect layer of the semiconductor device.

The landing pads can be formed within the interconnect layer such that top surfaces of the landing pads are coplanar with a top surface of the interconnect layer. The landing pads can be formed on any suitable conductive material, such as, e.g., metals including copper (Cu), among others. The landing pads can be formed within a dielectric material to from the interconnect layer. The dielectric material can be any insulating material, such as, e.g., $SiO_2$.

The block mask can be patterned using a positive tone process. However, negative tone processes are also contemplated.

At block 1002, recess the landing pad in the device region of the semiconductor device.

The landing pad of the device region can be recess using an etch process, such as, e.g., RIE. The etch process should etch the landing pad material selective to the block mask and the surrounding dielectric material of the interconnect layer.

At block 1003, form a cap in the recess of the landing pad in the device region.

The cap can be deposited in the recessed area of the landing pad using a suitable deposition process, such as, e.g., CVD. The cap can form a buffer or adhesion layer between the landing pad and a later formed memory device. Accordingly, the cap can be formed of suitable conductive buffer material, including, e.g., a metal nitride such as TaN, among others.

At block 1004, remove the block mask and selectively deposit topographical assist features over the landing pads of the alignment and logic region of the semiconductor device using a selective metal.

The topographical assist features can be grown using a selective metal by a deposition processing, such as, e.g., CVD or electroless plating. Accordingly, the topographical assist features will not be deposited on the dielectric material of the cap or the interconnect layer, and only on the exposed conductive material of the landing pads of the alignment and logic region. The deposited topographical assist features form a top surface that is above the interconnect layer, thus forming topographical features.

At block 1005, deposit a device multilayer over the interconnect layer, including the landing pads, cap and topographical assist features, the device multilayer having a constant thickness across the semiconductor device to form bump in a top surface thereof over the topographical assist features.

Each of layer of the device multilayer can be conformally deposited, thus forming layers of constant thickness across the semiconductor device. Because the layers are constant in thickness, the surface topography of the interconnect layer will affect the surface topography of the device multilayer. As a result, the topographical assist features formed over the landing pads of the second region will cause topographical features, such as, e.g., bumps, in the device multilayer that are vertically aligned with the topographical assist features, and thus vertically aligned with the landing pads. As a result, the topographical features of the device multilayer form reliable and precise alignment marks for aligning the semiconductor device.

At block 1006, align the semiconductor device according to the bumps in the device multilayer.

Because the topographical features of the device multilayer are vertically aligned with the landing pads of the second region, the semiconductor device can be aligned according to the topographical features based on known relationships between each landing pad. Thus, a position of the landing pad of device region can be easily determined, and accurately aligned for processing.

At block 1007, selectively etch the device multilayer to form a memory device stack aligned with the landing pad in the device region.

Upon aligning the semiconductor device, a mask can be patterned over the device multilayers. The mask can be patterned with a positive tone process, however negative tone processes are also contemplated. The patterning can establish a block mask over the landing pad in the device region. The remainder of the mask can then be removed to expose the device multilayer outside of the block mask.

Upon exposing the device multilayer, the device multilayer can be etched selective to the block mask to remove the device multilayer outside of the patterned area. As a result, a stack of layers remains only in the region under the block mask and aligned with the landing pad of the device region. This stack will form the embedded memory device, and the block mask can be removed.

At block 1008, bury the memory device stack in a dielectric fill and form contacts on both sides of the landing pad of the device region and at least one landing pad of the logic region.

A dielectric fill can be deposited over the semiconductor device and around the memory device. In order to form contacts for the memory device and for a power on reset, vias can be opened up through the dielectric fill down to the memory device and to at least one of the landing pads of the alignment and logic region. Similarly, vias can be opened up in the middle of line of the semiconductor device through the dielectric material of the interconnect layer up to the selected landing pads, including the landing pad of the device region. The vias can be filled with a conductive material, such as, e.g., a metal, including copper (Cu). Thus, contacts are formed in the semiconductor device corresponding to the landing pad of the device region as well as the at least one landing pad of the logic region.

Having described preferred embodiments of a system and method (which are intended to be illustrative and not limiting), it is noted that modifications and variations can be made by persons skilled in the art in light of the above teachings. It is therefore to be understood that changes can be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A semiconductor device, comprising:
   a dielectric material disposed on a substrate having a first landing pad in a device region and a second landing pad in an alignment region disposed within the dielectric material, the first landing pad having an uppermost surface that is lower than an uppermost surface of the second landing pad relative to the substrate;
   a cap disposed on the uppermost surface of the first landing pad in the device region;
   a topography assist layer that completely covers the second landing pad in the alignment region, and that does not cover the first landing pad, the topography assist layer having an uppermost surface that is at a different level than an uppermost surface of the cap relative to the substrate; and
   a memory device embedded in the dielectric material and aligned over the cap.

2. The semiconductor device as recited in claim 1, wherein each of the first landing pad and the second landing pad are formed of copper.

3. The semiconductor device as recited in claim 1, wherein the topography assist layer includes metal that is deposited on the second landing pad, selective to the cap.

4. The semiconductor device as recited in claim 1, wherein the cap includes a metal nitride barrier.

5. The semiconductor device as recited in claim 4, wherein the metal nitride barrier includes tantalum nitride.

6. The semiconductor device as recited in claim 4, wherein the metal nitride barrier includes cobalt nitride.

7. The semiconductor device as recited in claim 1, further including:
   front side contacts aligned with each of the memory device and the second landing pad in the alignment region; and middle of line contacts, aligned with each of the first landing pad in the device region and the second landing pad in the alignment region, that penetrate an entire thickness of the topography assist layer.

8. The semiconductor device as recited in claim 1, wherein the memory device further comprises:
an embedded magnetoresistive random access memory (MRAM) within the semiconductor device.

9. The semiconductor device as recited in claim 1, wherein the memory device further comprises:
an embedded resistive random access memory (RRAM) within the semiconductor device.

10. The semiconductor device as recited in claim 1, wherein the cap forms a conductive buffer between the first landing pad and the memory device.

11. The semiconductor device as recited in claim 1, wherein the cap forms an adhesion layer between the first landing pad and the memory device.

12. A semiconductor device, comprising:
a dielectric material disposed on a substrate having a first landing pad in a device region and a second landing pad in an alignment region disposed within the dielectric material, the first landing pad having an uppermost surface that is lower than an uppermost surface of the second landing pad relative to the substrate;
a cap disposed on the uppermost surface of the first landing pad in the device region, wherein the cap is coplanar with a top surface of an interconnect layer;
a topography assist layer that completely covers the second landing pad in the alignment region, and that does not cover the first landing pad, the topography assist layer having an uppermost surface that is at a different level than an uppermost surface of the cap relative to the substrate; and
a magnetoresistive random access memory (MRAM) memory device embedded in the dielectric material and aligned over the cap.

13. The semiconductor device as recited in claim 12, wherein each of the first landing pad and the second landing pad are formed of copper.

14. The semiconductor device as recited in claim 12, wherein the topography assist layer includes metal that is deposited on the second landing pad, selective to the cap.

15. The semiconductor device as recited in claim 12, wherein the cap includes a metal nitride barrier.

16. The semiconductor device as recited in claim 15, wherein the metal nitride barrier includes tantalum nitride.

17. The semiconductor device as recited in claim 15, wherein the metal nitride barrier includes cobalt nitride.

18. The semiconductor device as recited in claim 12, further including:
front side contacts aligned with each of the memory device and the second landing pad in the alignment region; and
middle of line contacts, aligned with each of the first landing pad in the device region and the second landing pad in the alignment region, that penetrate an entire thickness of the topography assist layer.

19. The semiconductor device as recited in claim 12, wherein the cap forms a conductive buffer between the first landing pad and the memory device.

20. The semiconductor device as recited in claim 12, wherein the cap forms an adhesion layer between the first landing pad and the memory device.

* * * * *